United States Patent [19]

Takai et al.

[11] Patent Number: 6,092,027
[45] Date of Patent: Jul. 18, 2000

[54] APPARATUS FOR DETECTING AND RECORDING A CONDUCTION NOISE, A RADIATION ELECTROMAGNETIC FIELD NOISE AND A DISCHARGE NOISE

[75] Inventors: Toshimitsu Takai; Minoru Kaneko; Tetsuya Kamura; Isamu Sato, all of Yokohama, Japan

[73] Assignee: Hitachi Electronics Services Co., Kanagawa-ken, Japan

[21] Appl. No.: 08/930,033

[22] PCT Filed: Mar. 19, 1996

[86] PCT No.: PCT/JP96/00720

§ 371 Date: Sep. 26, 1997

§ 102(e) Date: Sep. 26, 1997

[87] PCT Pub. No.: WO96/30774

PCT Pub. Date: Oct. 3, 1996

[30] Foreign Application Priority Data

Mar. 27, 1995 [JP] Japan .................................. 7-067873

[51] Int. Cl.[7] .................................................. G01R 29/36
[52] U.S. Cl. ............................ 702/38; 702/69; 702/189; 702/111; 324/613; 324/614
[58] Field of Search .......................... 702/38, 67, 69–80, 702/89, 99, 104, 106, 107, 111, 112, 130, 115–118, 121, 122, 124–126, 134, 136, 176–178, 182–185, 190, 191, 193–195, 197, 199, FOR 154, FOR 107–FOR 110, FOR 142, FOR 158, FOR 164, FOR 166; 324/613, 614, 620, 76.14, 76.19, 76.21, 76.22; 343/701, 703, 909; 340/310.03; 374/175

[56] References Cited

U.S. PATENT DOCUMENTS 5,228,780  7/1993  Shepard et al. ........................ 374/175
5,274,578  12/1993  North et al. ............................. 702/99
5,477,150  12/1995  Ham, Jr. et al. ....................... 324/613

FOREIGN PATENT DOCUMENTS

| 50-3380 | 1/1975 | Japan . |
|---|---|---|
| 62-91496 | 4/1987 | Japan . |
| 62-163768 | 10/1987 | Japan . |
| 4-289462 | 10/1992 | Japan . |
| 5-76501 | 3/1993 | Japan . |
| 5-76502 | 3/1993 | Japan . |
| 5-76503 | 3/1993 | Japan . |
| 5-223866 | 9/1993 | Japan . |
| 5-223867 | 9/1993 | Japan . |
| 5-342388 | 12/1993 | Japan . |
| 7-244104 | 9/1995 | Japan . |

*Primary Examiner*—Hal Wachsman
*Attorney, Agent, or Firm*—Antonelli, Terry, Stout & Kraus, LLP

[57] ABSTRACT

A noise detecting and recording apparatus which can be widely used for countermeasures against malfunction of electronic equipment which is caused by noises is provided. The apparatus is provided with a unit for outputting data corresponding to the level of a conduction noise, a unit for outputting the data corresponding to the level of a radiation electromagnetic field noise, a unit for outputting the data corresponding to the level of a discharge noise, a temperature and humidity detection unit for detecting temperature and humidity and outputting the data corresponding to the detected value, a microcomputer for processing the output data from each unit, a display unit for displaying the output data, and a recording device for recording data, wherein the microcomputer performs the processing of receiving the output data from each unit and supplying the data to the display unit, and the processing of receiving the output data from each unit and recording the data in the recording device.

34 Claims, 12 Drawing Sheets

FIG. 4
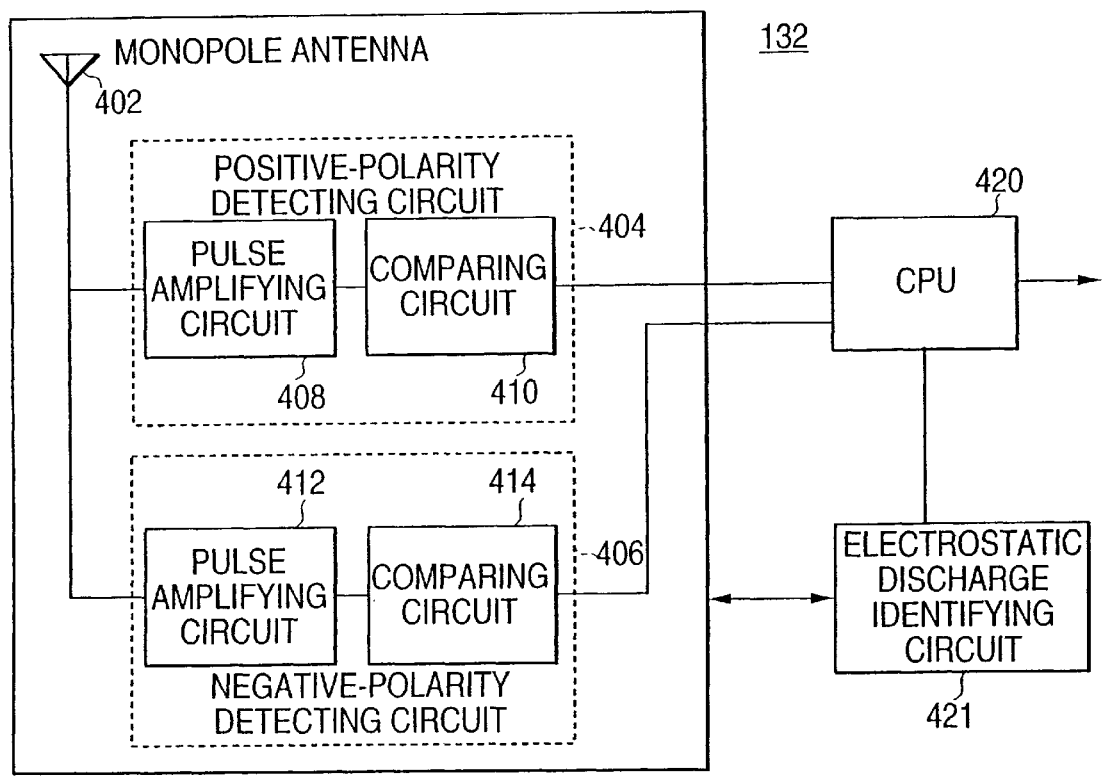
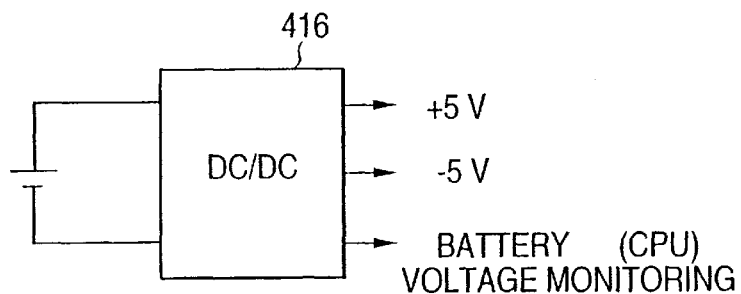

FIG. 8

| D6 | D5 | D4 | D3 | D2 | D1 | D0 |
|---|---|---|---|---|---|---|
| ID NUMBER | | STATUS | | DETECTION LEVEL | | |

| D2 | D1 | D0 | CONTENT |
|---|---|---|---|
| 1 | 1 | 0 | OVER REFERENCE VALUE 1 |
| 1 | 0 | 1 | OVER REFERENCE VALUE 2 |
| 1 | 0 | 0 | OVER REFERENCE VALUE 3 |
| 0 | 1 | 1 | OVER REFERENCE VALUE 4 |
| 0 | 1 | 0 | OVER REFERENCE VALUE 5 |

STATUS

| D4 | D3 | CONTENT | NOTE |
|---|---|---|---|
| 0 | 0 | BATTERY VOLTAGE IS REDUCED | SUBSEQUENT DATA ARE INVALID |
| 0 | 1 | UNDEFINED | |

ID NUMBER

| D6 | D5 | CONTENT |
|---|---|---|
| 0 | 0 | DISCHARGE NOISE UNIT |
| 0 | 1 | RADIATION FIELD NOISE UNIT |
| 1 | 0 | CONDUCTION NOISE UNIT |
| 1 | 1 | UNDEFINED |

FIG. 11

LIST D  * NOISE DETECTION STATUS *
(EVERYDAY)

LIST C  * NOISE DETECTION STATUS *
(OVERALL)

MEASUREMENT SITE CODE [••••]
MEASUREMENT SITE NAME [••••••••]
NAME OF PERSON WHO TAKES MEASUREMENT [••••]
COMMENT [••••••••]
MEASUREMENT TIME (FROM FEBRUARY 26, 1995 TO MARCH 10, 1995)

| | TOTAL DETECTION NUMBER | LEVEL 1 | LEVEL 2 | LEVEL 3 | LEVEL 4 |
|---|---|---|---|---|---|
| ELECTROSTATIC DISCHARGE NOISE (NEGATIVE) | 906 | 894 | 12 | 0 | 0 |
| ELECTROSTATIC DISCHARGE NOISE (POSITIVE) | 250 | 226 | 21 | 3 | 0 |
| TOTAL | 1156 | 1120 | 33 | 3 | 0 |
| OTHER NOISES (NEGATIVE) | 16 | 12 | 4 | 0 | 0 |
| OTHER NOISES (POSITIVE) | 11 | 0 | 11 | 0 | 0 |

LIST B   ELECTROSTATIC DISCHARGE NOISE 
MEASUREMENT DATA (MEASUREMENT SITE CODE) [••••]  (MEASUREMENT SITE NAME) [••••••••]
(NAME OF PERSON WHO TAKES MEASUREMENT) [••••]  COMMENT [••••••••]

ELECTROSTATIC DISCHARGE NOISE

| DETECTION DATE | DETECTION TIME | POLARITY LEVEL |
|---|---|---|
| 95/03/02 | 15:23:07 | +3 |
| 95/03/02 | 15:31:18 | -1 |

LIST A   MEASUREMENT HISTORY

(MEASUREMENT SITE CODE) [••••]  (MEASUREMENT SITE NAME) [••••••••]
(NAME OF PERSON WHO TAKES MEASUREMENT) [••••]  COMMENT [••••••••]
MEASUREMENT TERM (FROM FEBRUARY 26, 1995 TO MARCH 10, 1995)

| DATE | TIME | HISTORY |
|---|---|---|
| 95/02/26 | 11:50:33 | START MEASUREMENT |
| 95/03/10 | 15:27:12 | END MEASUREMENT |

FIG. 12
(a)
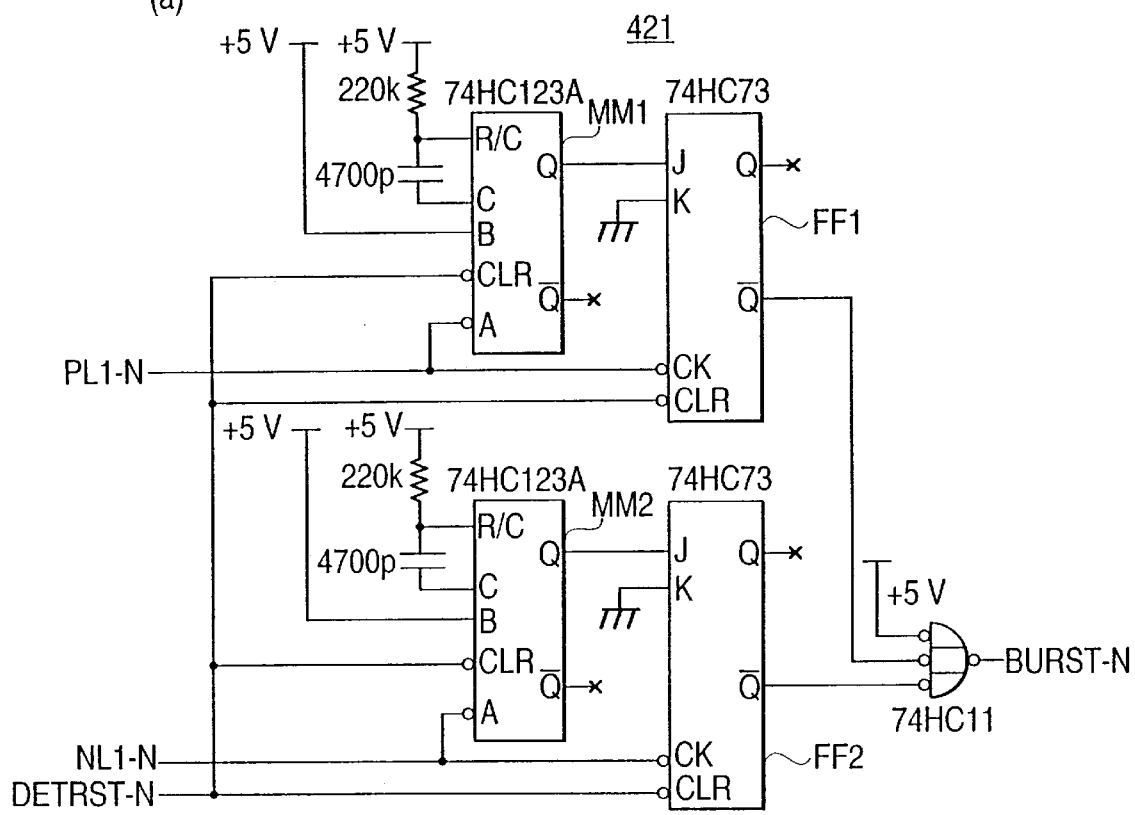
(b)
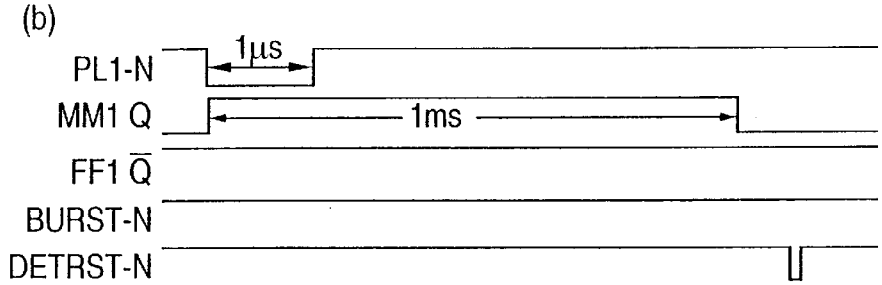
(c)
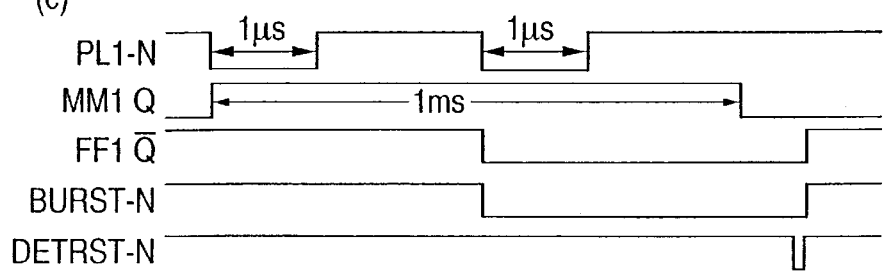

APPARATUS FOR DETECTING AND RECORDING A CONDUCTION NOISE, A RADIATION ELECTROMAGNETIC FIELD NOISE AND A DISCHARGE NOISE

TECHNICAL FIELD

The present invention relates to an apparatus which is portable so that it suffers no restriction in its set-up position and is designed in a simple construction to detect and record noises which are thought likely to cause an operational failure of electronic equipment, and particularly to an apparatus for detecting and recording noises which are considered likely to have an effect on the operation of an information processing device or a communication device.

BACKGROUND ART

There are some cases where various electronic equipment such as an information processing device, a communication device, etc. fail to function normally due to various noises. As examples of such noises that have adverse effects on these devices, there have been known electrostatic discharge noise, discharge noise which occurs at an electrical contact point of a switch, an electromagnetic relay or the like when the power is turned on/off, a radiation electromagnetic field noise occurring due to radio waves for TV broadcasting or cellular phones, and conduction noise which is transmitted through a power line or a signal line.

Such noises may induce some malfunction in electronic equipment. For example, when the electronic equipment drives a movable unit of a robot, the malfunction may cause a major problem such as an accident resulting in injury or death if the degree of the malfunction is sufficiently serious.

Accordingly, it is necessary to take countermeasures against the above-described noises for the electronic equipment. However, the countermeasure to be taken is varied in accordance with the cause of the noise. In addition, it requires a high cost to take countermeasures against the noises, and thus when electronic equipment is suspected of suffering from noise problems, it is necessary to detect and analyze the noise source in order to take a suitable countermeasure against the noise in accordance with the analysis result.

Japanese Patent Application No. Hei-06-36859 has proposed an electrostatic discharge detecting apparatus as an apparatus for detecting and recording discharge noise due to electrostatic discharge, one of the above-described noises against which countermeasures should be taken. However, the above-described electrostatic discharge detecting apparatus can detect only the electrostatic discharge noise, among various noises which cause malfunctions of various electronic equipment such as an information processing device, a communication device, etc.

According to the present invention, there is implemented an apparatus in which under the condition that it operates normally under such an environment that various noises having a high level occur, the occurrence of each of the noises which occur irregularly and have poor reproducibility is detected by each of sensors for detecting a discharge noise, a radiation electromagnetic field noise and a conduction noise, respectively, and the level of the detected noise is recorded together with the time of occurrence of the noise, thereby detecting and recording noises other than the electrostatic discharge noise.

That is, an object of the present invention is to provide a noise detecting and recording apparatus which can be widely used in connection with countermeasures against the malfunction of electronic equipment due to noises.

DISCLOSURE OF THE INVENTION

In order to attain the above object, the following means may be considered.

That is, a noise detecting and recording apparatus is provided with a first unit for detecting a conduction noise, and outputting data corresponding to the level of the detected noise, a second unit for detecting a radiation electromagnetic field noise and outputting data corresponding to the level of the detected noise, a third unit for detecting a discharge noise and outputting data corresponding to the level of the detected noise, a processing device for processing the output data from each unit, a display device for displaying data supplied thereto, and a recording device for recording the data.

It is a noise detecting and recording apparatus wherein the processing device performs processing of receiving the output data from each unit and supplying the data to the display device, and performs processing of receiving the output data from each unit and recording the output data in the recording device.

The noise detecting and recording apparatus may be further provided with a temperature detection unit for detecting the temperature and outputting the data corresponding to the detected value, and a humidity detection unit for detecting the humidity and outputting the data corresponding to the detected value, the processing device performing processing of the data output from the temperature detection unit and the humidity detection unit.

Further, the following mode may be considered.

That is, the noise detecting and recording apparatus is further provided with a time counting device for ascertaining the time, and the processing device detects the reception time using the time counting device when receiving the output data from any one of the first unit, the second unit and the third unit, and receives the temperature and humidity data from the temperature detection unit and the humidity detection unit to integrate the output data, the reception time and the temperature and humidity data into one data set and record the data set in the recording apparatus.

In this case, the noise detecting and recording apparatus may be provided with the processing device for supplying the data set to a display device to display the data set thereon.

The first unit detects the conduction noise, and outputs the data corresponding to the level of the detected noise. The second unit detects the radiation electromagnetic field noise and outputs the data corresponding to the level of the detected noise. Further, the third unit detects the discharge noise and outputs the data corresponding to the level of the detected noise.

The processing device receives the output data from the each unit and supplies the data to the display device, whereby the output data are displayed on the display device.

Further, the processing device receives the output data from each unit and records the data in the recording device.

It is preferable that the processing device receives the data corresponding to the temperature value detected by the temperature detection unit and the data corresponding to the humidity value detected by the humidity detection unit together with the output data from the first unit, the second unit and the third unit to display and record the temperature and humidity data together with the above data.

Further, the processing device detects the reception time using the time counting device when receiving the output data from any one of the first unit, the second unit and the third unit, and receives the temperature and humidity data from the temperature detection unit and the humidity detection unit to integrate the output data, the received data and the temperature and humidity data into one data set and record the data set in the recording device.

In this case, the processing device supplies the data set to the display device to display the data set.

The processing device is driven only when the variation of the output level from each unit is above a predetermined value, whereby collection of unnecessary data is avoided and a power saving function of the device can be implemented.

BRIEF DESCRIPTION OF THE DRAWINGS

FIG. 4 is a block diagram showing a discharge noise detection unit.

FIG. 8 is a diagram showing the structure of data which are transmitted from the detection unit.

FIG. 11 is a diagram showing a measurement result report of discharge noise.

FIG. 12 is a block diagram showing the detailed construction of an electrostatic discharge identifying circuit.

BEST MODE IMPLEMENTING THE INVENTION

An embodiment according to the present invention will be described with reference to the accompanying drawings.

First, in order to make the understanding easy, the schematic construction of the apparatus of an embodiment will be described, then each constituent element will be described, and finally the operation thereof will be described while referring to flowcharts and the detailed construction of the apparatus.

Figure 1:
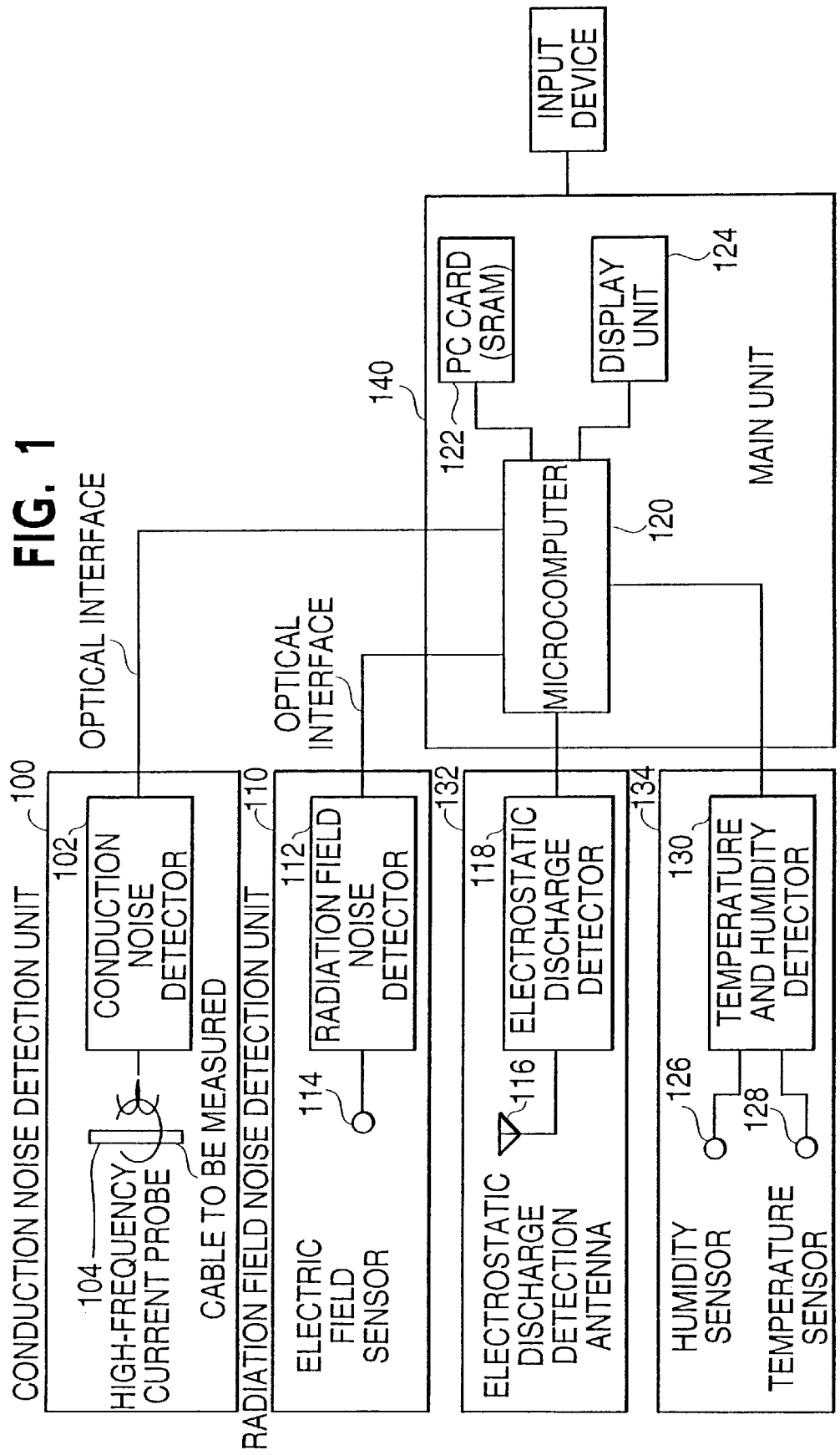
FIG. 1 is a schematic block diagram showing the construction of an apparatus according to the present invention.

First, the schematic construction of the apparatus according to the present invention is shown in FIG. 1.

The apparatus of this embodiment includes a conduction noise detection unit 100, a radiation electromagnetic field noise detection unit 110, a discharge noise detection unit 132, a temperature and humidity detection unit 134 and a main unit 140.

The conduction noise detection unit 100 includes a high-frequency current probe 104, and a conduction noise detector 102. The high-frequency current probe 104 detects high-frequency current flowing in a cable being measured or the like which is a measurement target, and the conduction noise detector 102 performs predetermined processing on the detected current data and transmits the processed data through an optical interface to a microcomputer 120 which is provided in the main unit 140.

The radiation electromagnetic field noise detection unit 110 includes an electric field sensor 114 for detecting the intensity of electric field, and a radiation electromagnetic field noise detector 112, and the radiation electromagnetic field noise detector 112 performs predetermined processing on the electric-field intensity data detected by the electric field sensor 114 and transmits the processed data through an optical interface to the microcomputer 120 which is provided in the main unit 140.

The discharge noise detection unit 132 includes an electrostatic discharge detection antenna 116 for receiving electromagnetic field which is generated by the quick motion of charges due to discharge, and an electrostatic discharge detector 118 for detecting the electrostatic discharge level, and the data detected by the electrostatic discharge detector 118 are transmitted to the microcomputer 120 which is provided in the main unit 140.

The temperature and humidity detection unit 134 includes a humidity sensor 126 and a temperature sensor 128 for detecting humidity and temperature respectively, and a temperature and humidity detector 130 for receiving the output signals from these sensors as input signals to perform predetermined processing on these signals, and transmitting the processed data to the microcomputer 120 which is provided in the main unit 140.

Although not shown, it is needless to say that a connection line between the discharge noise detection unit 132 and the microcomputer 120 and a connection line between the temperature and humidity detection unit 134 and the microcomputer 120 may be connected to each other through an optical cable.

The main unit 140 includes the microcomputer 120, a PC card 122 for recording data, and a display unit 124.

The microcomputer 120 is ordinarily provided with at least an MPU and a ROM (not shown), and the MPU performs predetermined processing according to a program which is stored beforehand in the ROM.

The above processing includes the processing of receiving the data from each unit and storing the data in a PC card (a driver device for storing the data into the PC card is not shown), the processing of displaying the received data on a display unit 124, etc. The detailed processing content will be described later.

The apparatus is designed so that a user can display on the display unit 124 the data recorded in the PC card by generating an instruction from the input device. Further, programs may be formed so as to be contained in the ROM so that the corresponding processing is performed in response to other types of instructions.

Further, the user may pull out the PC card from the apparatus to mount the PC card in a driver device which is provided in another personal computer or the like, and read out recorded data to perform analysis work.

The display unit 124 is implemented by a liquid crystal display, a compact CRT, an EL device or the like, and each of the constituent elements thereof is ordinarily contained in a housing having a shielding function against electromagnetic waves while only a display face of the display unit 124 is exposed to the outside. Although not specially illustrated, an apparatus which is compact and excellently transportable can be implemented.

Although not shown in FIG. 1, it is preferable that the apparatus is provided with a time detecting device such as a clock or the like, and when data transmitted from each unit are recorded or displayed, the reception time is recorded and displayed together with the data.

Next, the construction of the conduction noise detection unit 100 shown in FIG. 1 will be described with reference to FIG. 2.

Figure 2:
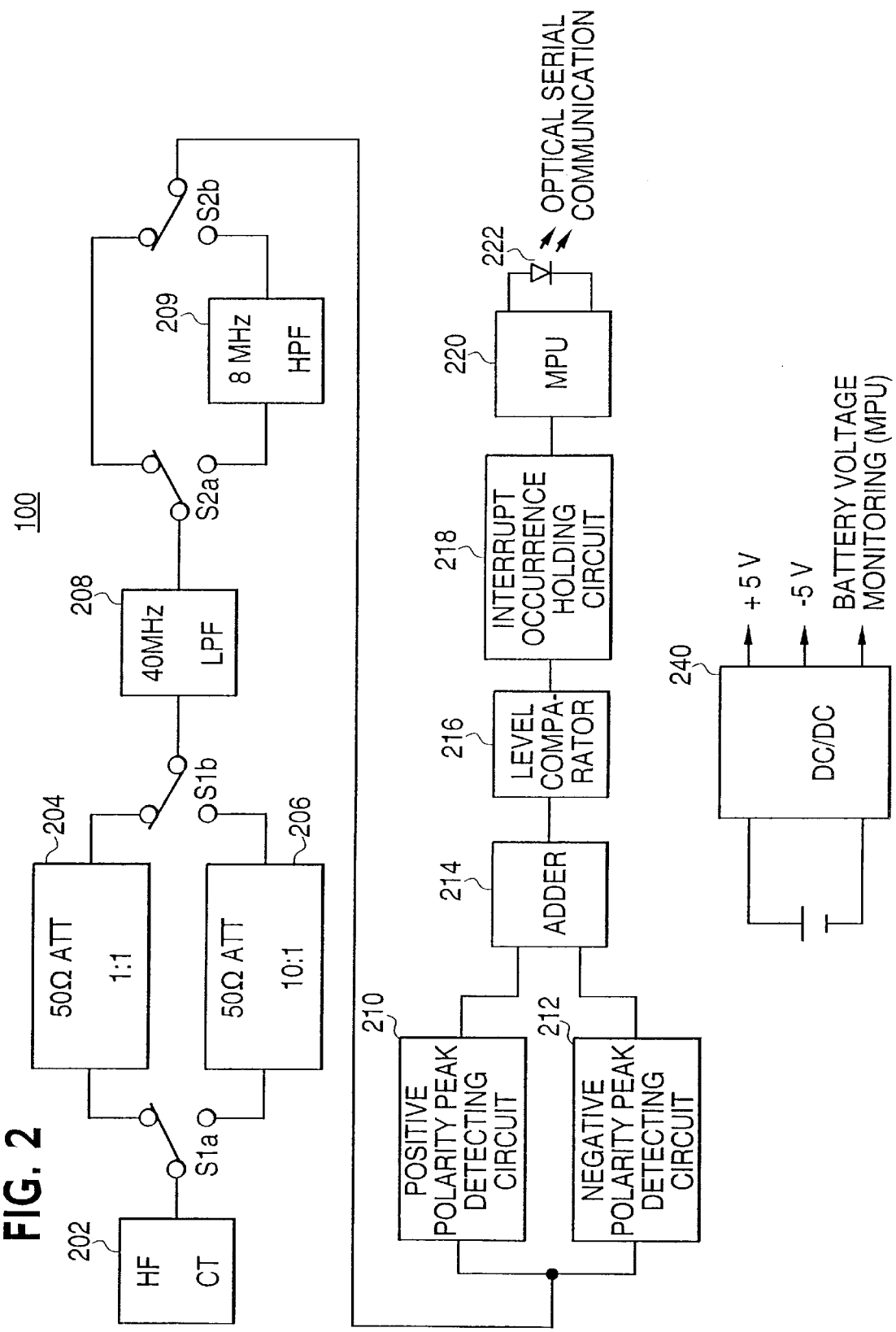
FIG. 2 is a block diagram showing a conduction noise detection unit

The conduction noise detection unit 100 shown in FIG. 2 includes a high-frequency current transformer (HFCT) 202, attenuators 204 and 206, a low-pass filter 208, a high-pass filter 209, a positive-polarity peak detection circuit 210, a negative-polarity peak detection circuit 212, an adder 214, a level comparator 216, an interrupt occurrence holding circuit 218, an MPU 220, and an LED 222. The MPU 220 operates according to a program which is contained in the ROM (not shown).

A battery is used as a power source for the unit to prevent occurrence of undesired noises, and a voltage which is obtained by converting the battery, voltage to a desired DC voltage in a DC/DC converter 240 is supplied to a desired place. A signal for monitoring the battery voltage is input to the MPU 220, and it is notified as a status signal to the microcomputer side that the battery voltage is reduced and the detection data may be inaccurate.

Switches S1a, S1b, S2a and S2b are designed to be operated by a dip switch provided on the surface of the housing so that they are switchable by a manual operation.

The operation of the conduction noise detection unit 100 will be described hereunder.

The high-frequency current transformer (HFCT) 202 induces the voltage corresponding to the high-frequency current flowing in various data lines such as a power line, a signal line, etc. which are targets to be measured in a non-contact state. The induced voltage is attenuated by the attenuator 204 (having attenuation of 1:1) or the attenuator 206 (attenuation of 10:1) by the selection of the switch S1a and the switch S1b which is switched interlockingly with the S1a.

The switch S1a, the switch S1b and the attenuators 204 and 206 are provided to expand a measurement range, and the number of stages and the attenuation ratio thereof can be suitably selected.

The attenuated voltage is filtered by a low-pass filter 208, and if necessary it is further filtered with a high-pass filter 209 by the switch S2a and the switch S2b which is switched interlockingly with the switch S2a. The low-pass filter 208 is provided to remove signal components which exceed the upper limit frequency of a measurement frequency range which is determined as a specification of the conduction noise detection unit. Further, the high-pass filter 209 and the switches S2a and S2b are designed to be usable by switching the lower limit frequency of the measurement frequency range. The characteristic of each filter is set to be optimum at the circuit design stage.

Next, the signal is input to the positive-polarity peak detecting circuit 210 and the negative-polarity peak detecting circuit 212, and the positive-polarity peak and the negative-polarity peak of the induced voltage are detected.

The adder 214 composites the positive-polarity peak and the negative-polarity peak with each other.

The level comparator 216 is provided with comparators for a plurality of reference levels which are predetermined, and it is judged whether the input composite result exceeds the reference level of any comparator. When the input composite level exceeds one reference level, the pulse signal corresponding to the reference level is output. Further, when it exceeds the plurality of reference levels, the pulse signal corresponding to the maximum reference level of these reference levels is output. The pulse signal may be designed so that the pulse width or the pulse number of the pulse signal is increased in accordance with the magnitude of the reference level, but it is preferable that the pulse signal is converted to the digital data of a value corresponding to the reference level concerned.

The interrupt occurrence holding circuit 218 which receives the pulse signal transmits an interrupt signal to the MPU 220, and in response to the interrupt signal the MPU 220 performs interrupt processing.

The data may be transmitted to the main unit side only when the detection (noise) level varies.

The MPU 220 serially transmits the digital data corresponding to the output pulse of the level comparator 216. When the data are serially transmitted, the data are transmitted while electro-optically (E/O) converted by an LED 222. As shown in FIG. 8, the MPU 220 transmits to the microcomputer side of the main unit an ID number of its own unit, a status representing the state of the power source voltage of the unit and the set status of the switches S1a, S1b, S2a and S2b, and the data of the detection level.

Through the above operation, the data of the conduction noise level can be detected and transmitted.

A plurality of reference levels are set, and only the data whose levels exceed some reference level are transmitted to the main unit, so that it is unnecessary to transmit to the main unit side the data of all conduction noises which are sampled and collected in a sampling time, resulting in enhancement of the processing speed and saving capacity.

Next, the construction of the radiation electromagnetic field noise detection unit 110 shown in FIG. 1 will be described with reference to FIG. 3.

Figure 3:
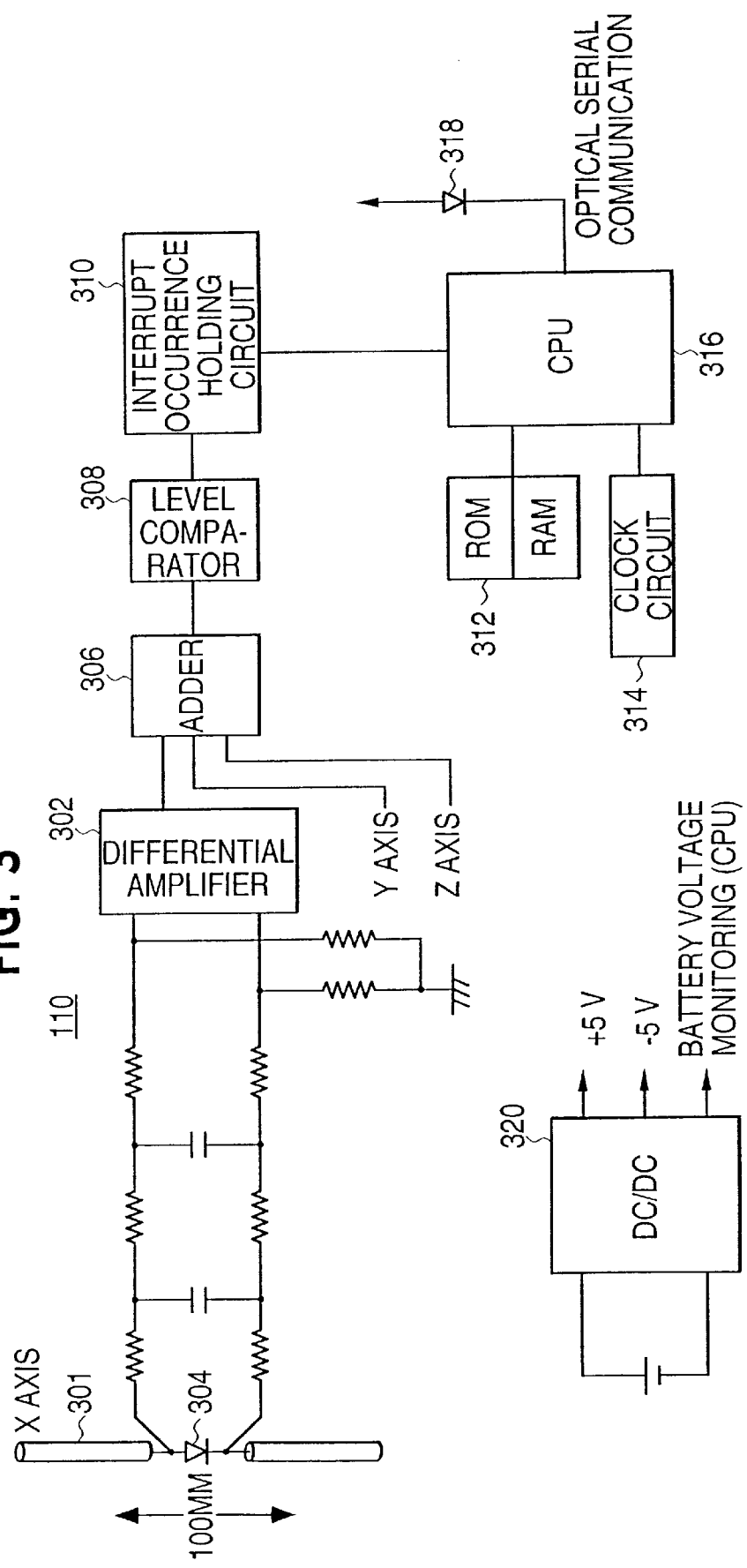
FIG. 3 is a block diagram showing a radiation electromagnetic field noise detection unit.

The radiation electromagnetic field noise detection unit 110 shown in FIG. 3 includes a broad band antenna 301, a detecting diode 304, a differential amplifier 302, an adder 306, a level comparator 308, an interrupt occurrence holding circuit 310, a CPU 316, a ROM, a RAM 312, a clock circuit 314, and an LED 318. The CPU 316 operates according to a program which is contained beforehand in the ROM 312. The CPU 316 operates in synchronism with a clock signal supplied from a clock circuit 314.

A battery is used as a power source for the radiation electromagnetic field noise detection unit 110 to prevent occurrence of undesired noises, and the battery voltage thereof is converted to a desired DC voltage by a DC/DC converter 320, and then supplied to a desired place. A signal for monitoring the battery voltage is input to the CPU 316, and it is notified as a status signal to the microcomputer side that the battery voltage is reduced and thus the detection data may be inaccurate.

The broad band antenna 301 is a cylindrical antenna which is symmetrical between the right and left sides (upper and lower sides in FIG. 5) and has a feeding point at the center of the element. The cylinder used for the element is formed of good conductor which has extremely low loss, and the band is broadened by suitably setting the ratio of the length of the cylinder to the diameter. The detecting diode 304 is directly attached to the feeding point of the broad band antenna 301. Undesired high-frequency components are removed from the signal detected by the detecting diode 304 using one type of filter circuit comprising a resistor and a capacitor to form a DC signal, and then the DC signal is input to the differential amplifier 302.

The operation of the radiation electromagnetic field noise detection unit 110 will be described hereunder.

According to the present invention, the broad band antenna 301, the detecting diode 304, the filter circuit comprising the resistor and capacitor and the differential amplifier 302 constitute an electric field sensor for outputting the voltage corresponding to the magnitude of only the component in one axis (X-axis) direction of the electric field intensity of an electromagnetic wave. Although omitted from the drawings, an electric field sensor having the same construction is provided in each of the Y and Z axis directions.

The output voltages of the electric field sensors corresponding to the respective axes are subjected to vector composition by an adder 306. As a result, at the output of the adder 306 is obtained the voltage corresponding to the absolute value of the vector composition of the electric field intensity levels on the respective axes, that is, an electric field intensity level which is uniform to radiation electromagnetic field noises having any polarization plane.

The adder 306 may be designed as a circuit construction in which priorities are given to power consumption and cost, and the arithmetical mean of the values on the respective axes is set as an electric field intensity level although sacrificing the uniformity in the plane of polarization of the wave source of the radiation electromagnetic field noise serving as a measurement target.

The level comparator 308 is provided with comparators for plural reference levels which are predetermined, and first judges whether an input composite result is larger than the reference level of some comparator. If the input composite level exceeds one reference level, the pulse signal corresponding to the reference level is output. If it exceeds plural reference levels, the pulse signal corresponding to the maximum reference level of these reference levels is output. The pulse signal may be designed so that the pulse width or the pulse number thereof is increased in accordance with the magnitude of the reference level, but it is preferably converted to digital data corresponding to the reference level concerned and then output.

The interrupt occurrence holding circuit 310 which receives the pulse signal transmits an interrupt signal to the CPU 316, and in response thereto the CPU 316 performs interrupt processing.

The data may be transmitted to the main unit only when the detection (noise) level varies.

The CPU 316 serially transmits the digital data corresponding to the output pulse of the level comparator 308. When the data are serially transmitted, the data are subjected to E/O conversion by an LED 318 and then transmitted. As shown in FIG. 8, the CPU 316 transmits to the microcomputer side of the main unit 140, data comprising an ID number of its own unit, a status representing the state of the power source voltage of the unit, and detection level.

Through the above operation, the data of the radiation electromagnetic field noise level can be detected and transmitted.

A plurality of reference levels are set, and only the data whose levels exceed some reference level are transmitted to the main unit, so that it is unnecessary to transmit to the main unit side the data of all radiation electromagnetic field noises which are sampled and collected in a sampling time, resulting in enhancement of the processing speed and the saving capacity of electricity.

Next, the discharge noise detection unit 132 for detecting a discharge noise such as static electricity or the like will be briefly described with reference to FIG. 4.

The discharge noise detection unit 132 includes a monopole antenna 402, a positive-polarity detection circuit 404, a negative-polarity detection circuit 406, an electrostatic discharge identifying circuit 421 and a CPU 420.

Further, the positive-polarity detection circuit 404 includes a pulse amplifying circuit 408 and a comparing circuit 410, and the negative-polarity detection circuit 406 includes a pulse amplifying circuit 412 and a comparing circuit 414.

A battery is used as a power source for the unit to prevent occurrence of undesired noises, and a voltage which is obtained by converting the battery voltage to a desired DC voltage in a DC/DC converter 416 is supplied to a desired place. A signal for monitoring the battery voltage is input to the CPU 416, and it is preferable that it is notified as a status signal to the microcomputer side that the battery voltage is reduced and the detection data may be inaccurate.

The operation of the discharge noise detection unit 132 will be described hereunder.

A voltage corresponding to the electric field intensity variation of a transit electromagnetic wave, which is generated due to discharge containing electrostatic discharge, is induced in the monopole antenna 402.

The pulse amplifying circuits 408 and 412 individually amplify the induced voltage at positive and negative polarities respectively. Further, the comparing circuit 410 is provided with comparators for a plurality of predetermined reference levels, and first judges whether an output of the pulse amplifying circuit 408 thus input is larger than the reference level of some comparator. If the output of the pulse amplifying circuit 408 thus input exceeds one reference level, the pulse signal corresponding to the reference level is output. If it exceeds the plurality of reference levels, the pulse signal corresponding to the maximum reference level of these reference levels is output. The pulse signal may be designed so that the pulse width or the pulse number thereof is increased in accordance with the magnitude of the reference level, however, it is preferably converted to digital data corresponding to the reference level concerned and then output.

The above operation is for the positive-polarity pulse, but the same operation is performed on the negative-polarity pulse by the pulse amplifying circuit 412 and the comparing circuit 414.

The electrostatic discharge identifying circuit 421 works as follows. That is, only an input which conforms to such a condition that no next input occurs until a predetermined time elapses from reception of the outputs of the comparing circuits 410, 414 is regarded as discharge caused by electrostatic discharge in various types of discharge. Conversely, discharge which does conform to the above condition is regarded as discharge due to other factors than the electrostatic discharge. Accordingly, data for identifying both the discharge types can be generated and then transmitted to the main unit side to record or display the data concerned, and thus this circuit is used for convenience of analysis.

The CPU 420 transmits to the microcomputer side an ID number of the unit thereof, a status representing the state of the power source voltage of its own unit, and data of detection level as shown in FIG. 8

Through the above operation, the data of the discharge noise level can be detected and transmitted.

A plurality of reference levels are set, and only the data whose levels exceed some reference level are transmitted to the main unit, so that it is unnecessary to transmit to the main unit side the data of all radiation electromagnetic field noises which are sampled and collected in a sampling time, resulting in enhancement of the processing speed and the saving capacity of electricity.

Further, each unit may be designed to convert the detection data to digital data and then to output the digital data only when the data to be detected is varied by a predetermined value or more.

That is, the magnitude of each noise is classified on the assumption that it would have plural levels, and only when level variation occurs in the noise data, the maximum level of levels which are exceeded by the noise concerned is digitally converted and a digital signal thus obtained is transmitted to the main unit, whereby the data amount to be processed can be greatly reduced.

Figure 10:
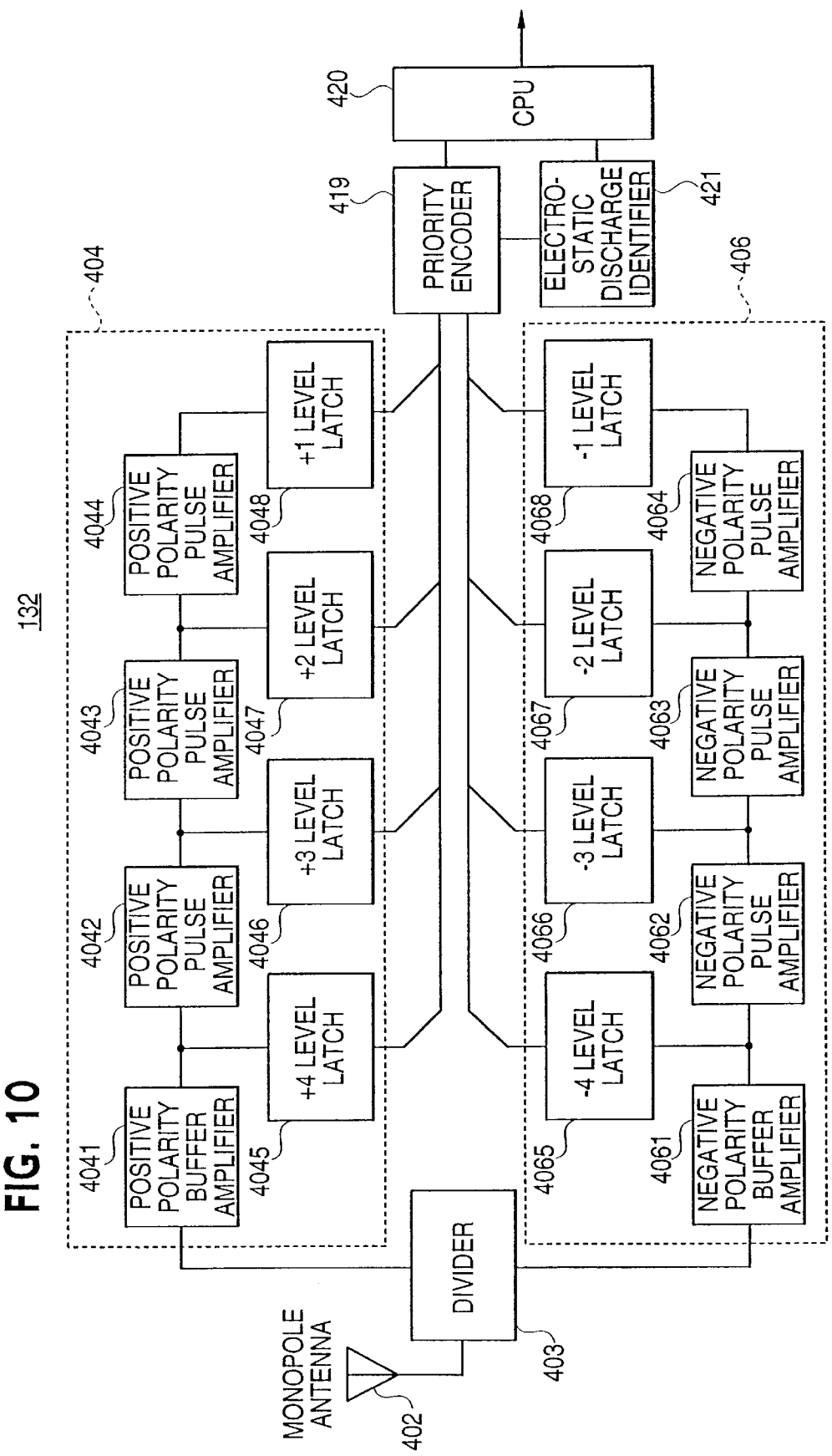
FIG. 10 is a block diagram showing a discharge noise detection unit.

FIG. 10 shows a further specific construction of the discharge noise detection unit 132. This circuit performs four-level detection for each of both the positive-polarity and negative-polarity noises. The voltage which is induced in the monopole antenna 402 by noises is input to a positive-polarity detector 404 and a negative-polarity detector 406 through a divider 403. The positive-polarity detector 404 includes a positive-polarity buffer amplifier 4041 and positive-polarity pulse amplifiers 4042, 4043 and 4044 which are connected in series, and also has +4 level latch 4045, +3 level latch 4046, +2 level latch 4047 and +1 level latch 4048. Each of these amplifiers corresponds to the pulse amplifying circuit 408 of FIG. 4, and each of the level latches corresponds to the comparing circuit 410 of FIG. 4. When the positive-polarity noise is below a first reference level, none of the level latches 4045 to 4048 generate an output (logic 1 signal). when it is beyond the first reference level, an output is generated at only the +1 level latch 4048 which receives the final-stage pulse amplified at multiple stages. When the positive-polarity noise exceeds a second reference level, an output is also generated in the +2 level latch 4047 in addition to the +1 level latch 4048. Further, as the noise is magnified, the +3 level latch 4046 and the +4 level latch 4045 successively generate an output. Each output of the level latches 4045 to 4048 is input to a priority encoder 419 to detect the logic 1 signal of the highest level latch (at the left side in the figure) of the level latches which generate the logic 1 signal.

The operation of the amplifiers 4061 to 4064 and the level latches 4065 to 4068 are the same as the amplifiers 4041 to 4044 and the level latches 4045 to 4048 except that they are used not for the positive-polarity noise, but for the negative-polarity noise.

By using the multistage amplifiers as described above, the same construction can be adopted for the respective level latches each functioning as a comparing circuit. However, the present invention is not limited to the above construction.

FIG. 12 shows the detailed construction of the electrostatic discharge identifying circuit 421. In the figure, the input of the electrostatic discharge identifying circuit is a signal PL1-N which is the output of the positive-polarity detection circuit 404 (+1 level latch 4048 in FIG. 10) or a signal NL1-N which is the output of the negative-polarity detection circuit 406 (−1 level latch 4064 in FIG. 10), and the signals are pulses having a pulse width of 1 $\mu$s which correspond to the levels ±1 (quick variation of electric field intensity which exceeds the first reference level). The electrostatic discharge identifying circuit 421 checks whether the input thereto conforms to such an identifying condition of electrostatic discharge that 1 ms or more elapses from the leading edge of the signal (representing that the quick variation of the electric field due to electrostatic discharge is detected once) until the leading edge of next PL1-N or NL1-N. The elapse of 1 ms or more is the condition which is set in consideration of the fact that the electrostatic discharge does not occur repetitively at plural times (that is, it occurs only once).

The Q output of a monostable multivibrator MM1, 2 is set to "true" for 1 ms by the leading edge of PL1-N or NL1-N. PL1-N or NL1-N is set to "false" after 1 $\mu$s from the leading edge. In the case of electrostatic discharge, the signal becomes a one-shot pulse, and thus no next discharge occurs while the Q output of the monostable multivibrator is "true". Accordingly, the signal of BURST-N for notifying to the CPU 420 that the induced voltage input to the antenna is not caused by electrostatic discharge becomes a "false" output. The CPU 420 judges that the discharge corresponds to the electrostatic discharge, and transmits the detection result to the microcomputer 120. The microcomputer 120 which receives the detection result and can record and display the electrostatic discharge level and the electrostatic discharge occurrence time in such a format as shown in FIG. 11, for example. Further, the CPU 420 outputs a reset signal DETRET-N to each circuit to get ready for detection of a subsequent electrostatic discharge. On the other hand, in the case of discharge other than the electrostatic discharge, the discharge is continually repeated a plurality of number of times, and thus a subsequent discharge occurs during 1 ms for which the Q output of the monostable multivibrator is set to "true", and PL1-N or NL1-N is set to "true" again. As a result, PL1-N or NL1-N is input to a clock input of a J-K type flip flop (FF1,2) and the Q output of the monostable multivibrator is input to a J input of the J-K type flip flop. When the clock input meets the leading edge while the Q output of the monostable multivibrator is "true", an NOT Q output of the J-K type flip flop is set to "true", and the BURST-N signal becomes a "true" output. The CPU 42 judges that the detected quick variation of the electric field intensity is caused by discharge other than the electrostatic discharge, and outputs a reset signal DETRST-N to each circuit to get ready for the detection of a subsequent electrostatic discharge. The BURST-N signal returns to a "false" output when DETRES-N is output.

Figure 5:
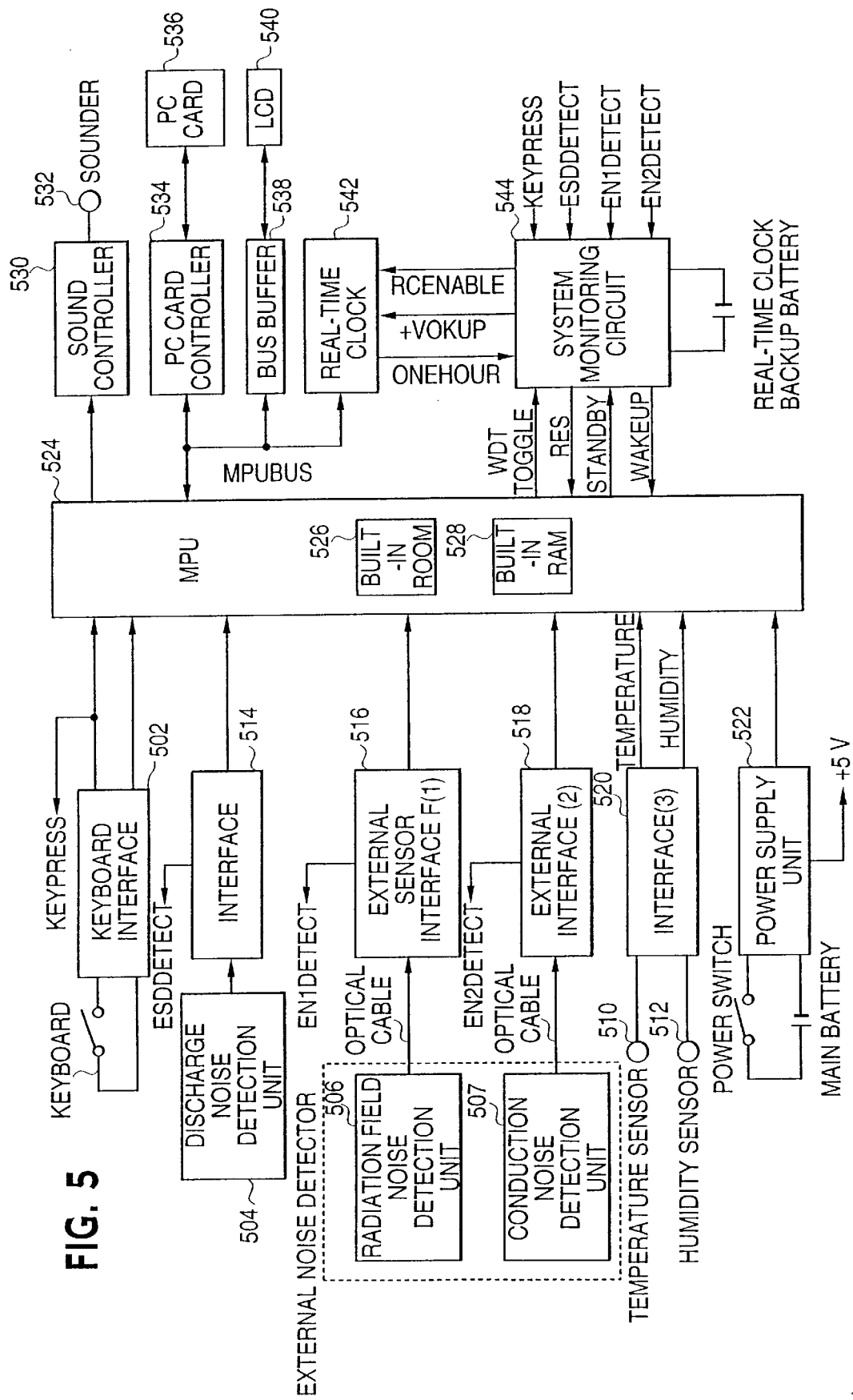
FIG. 5 is a block diagram showing the detailed construction of the apparatus according to the present invention.

The further embodied construction of the apparatus shown in FIG. 1 is shown in FIG. 5. In FIG. 5, system peripheral circuits of MPU 524 (corresponding to the microcomputer 120 of FIG. 1) are shown together with the detection means of noises. The construction of the apparatus of this embodiment will be described hereunder.

First, the construction on various detection units disposed at the left side of the figure will be described. These units are basically similar to the detection units 100, 110, 132 and 134 shown in FIG. 1.

A discharge noise detection unit 504 is connected through an interface 514 to an analog data input terminal of the MPU 524. The MPU 524 has a built-in A/D converter to convert input analog data of temperature and humidity to digital data.

The interface 514 outputs an "ESDdetect" signal when data are transmitted from the discharge noise detection unit 504.

A radiation electromagnetic field noise detection unit 506 is connected to the MPU 524 through an external sensor interface (1) 516 which is connected through an optical cable, and receives and transmits data from and to the MPU 524 through the external sensor interface (1) 516.

The External sensor interface (1) 516 outputs an "EN1detect" signal when data are transmitted from the radiation electromagnetic field noise detection unit 506.

A conduction noise detection unit 507 is connected to the MPU 524 through an external sensor interface (2) 518 which is connected through an optical cable, and receives and transmits data from and to the MPU 524 through the external sensor interface (2) 518.

The external sensor interface (2) 518 outputs "EN2detect" signal when data are transmitted from the conduction noise detection unit 507.

The temperature and humidity data which are output from the temperature sensor 510 and the humidity sensor 512 are transmitted to the analog data input terminal of the MPU 524 through an interface (3) 520. The MPU 524 is provided with a built-in A/D converter to convert the input analog data of temperature and humidity to digital data.

Next, the construction of the microcomputer will be described.

The MPU 524 is provided with a built-in ROM 526 and a built-in RAM 528.

The built-in ROM 526 contains a program which is prepared beforehand, and the MPU 524 operates according to the program. Further, the built-in RAM 528 is used as a stack storage area and a work area.

A keyboard serving as an input device is connected through a keyboard interface 502 to the MPU 524, and the MPU 524 receives input data from the keyboard.

The keyboard interface 502 outputs a "keypress" signal when a data input operation is performed by the keyboard.

The actuation of the apparatus of this embodiment is started by turning on a power switch. A power supply unit 522 which uses a main battery as a power source supplies power to the MPU 524, and supplies "+5 V" to desired places.

A sound controller 530 for driving a sounder 532 having a sounding function is actuated when it receives a start signal from the MPU 524 when the MPU 524 judges that some detection unit detects a noise.

A PC card controller 534 receives information on the noise level and the noise type from the MPU 524 and time information from a real time clock 542 having a clock function, and records the received information in the PC card 536.

These information are displayed through a bus buffer 538 on an LCD 540.

Next, a system monitoring circuit 544 will be described.

The system monitoring circuit 544 monitors the voltage of the "+5 V" power source, monitors runaway and controls restoration of the program of the MPU 524, controls power saving, and controls the switching operation of the power source to the real-time clock 542.

The voltage monitoring of the "+5 V" power source is performed by monitoring at all times whether the voltage of the "+5 V" power source which is supplied from the power supply unit 522 to the MPU 524 and the peripheral parts is within a voltage range (for example, 5 V ±5%) in which the normal operation of ICs constituting the circuit of each part is guaranteed. If it is detected that the power source voltage to be monitored is out of the normal IC operation range, even instantaneously, a reset signal (RES) is output to the MPU 524 for the period from the instantaneous time until the power source voltage is returned to the normal voltage and then a predetermined time elapses.

The program runaway monitoring and restoring control of the MPU 524 are performed using cooperation of the program stored in the built-in ROM 526 and a runaway monitoring timer (normally called a watch dog timer) in the system monitoring circuit 544. First, the program stored in the built-in ROM 526 is set so that "WDTtoggle" signal which is an input of the runaway monitoring timer is varied from high to low or from low to high within a predetermined time (for example, 1.6 seconds) in all the operation flow. The runaway monitoring timer monitors the level variation of the "WDTtoggle" signal at all times. If no level variation occurs in the signal, even when a predetermined time or more elapses, it is judged that the program of the MPU 524 runs away, and the reset signal (RES) is output to the MPT 524. However, when the MPU 524 is set to a low power consumption mode for power saving, a "standby" signal is output from the MPU 524, and no reset signal (RES) is output even when the "WDTtoggle" signal is not varied.

The control of the switching operation of the power source to the real-time clock 542 is performed as follows. The voltage output of a real-time clock backup battery is stopped while "+5(V)" is supplied from the power supply unit 522 to the real-time clock 542, and when the supply of "+5(V)" from the power supply unit 522 is stopped, the voltage of the real-time clock backup battery is output to the real-time clock 542 by "+Vbkup", thereby continually operating the real-time clock 542. The MPU 524 monitors the voltage supplied from the power supply unit 522 to detect the reduction of the voltage of the main battery.

In order to prevent undesired rewriting due to noises or the like, a read/write access can be performed from the MPU 524 to the real-time clock 542 only when an "RC enable" signal (active low) which is output from the system monitoring circuit 544 to the real-time clock 542 is low ("+5(V)" is accurate and the MPU does not run away).

Further, in this embodiment, the power saving control is performed by using the low power consumption mode which is one of the functions which are provided in the MPU 524. In the low power consumption mode of the MPU 524, a quartz oscillator (not shown) for generating an operation timing is stopped although the MPU 524 is kept in a power supply state. Since the MPU 524 is formed by a CMOS circuit, the current to be consumed in the low power consumption mode is limited to a leakage current.

The MPU 524 is automatically shifted to the low power consumption mode when any event such as detection of various types of noises or the like does not occur for a predetermined time. The restoration from the low power consumption mode is performed when the system monitoring circuit 544 is supplied with the signal of "keypress", "ESDdetect", "EN1detect", "EN2detect" or a "onehour" signal which is transmitted from the real-time clock 542 every hour.

When these signals are input to the system monitoring circuit 544, the system monitoring circuit 544 outputs a "wakeup" signal to the MPU 524, and the MPU 524 releases the low power consumption mode.

The method of using the low power consumption mode is as described above, but the apparatus may be designed so that no power consumption mode is used.

The basic operation of the apparatus of this embodiment will be described with reference to flowcharts.

Figure 6:
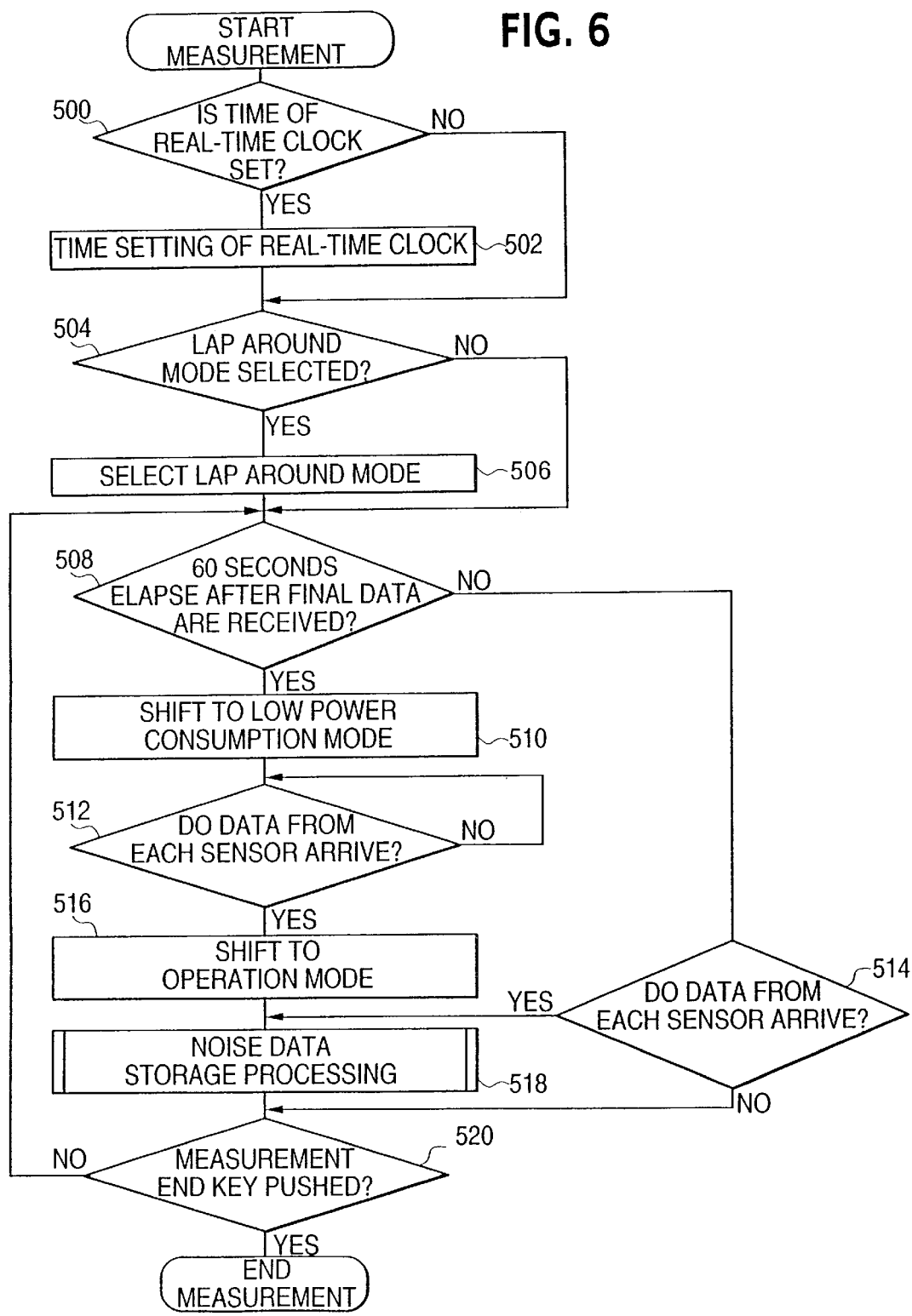
FIG. 6 is a flowchart showing the basic operation of the apparatus.

First, in step 500 of FIG. 6, it is judged whether the time setting of the real-time clock 542 should be performed. The display of the time on the LCD 540 and the time setting in the real-time clock 542 are performed on the basis of a command which is input from the keyboard.

In step 500, if it is judged that the time setting is unnecessary (NO), the process goes to step 504. In the other cases, the time setting is performed in step 502.

Subsequently, it is judged in step 504 whether a wrap around mode is selected.

The selection of this mode is performed on the basis of a command input from the keyboard.

Here, the wrap around mode is defined as a mode in which when the data recording area of the PC card is filled, data are overwritten from the head of the data recording area.

If the wrap around mode is not selected in step 504, the process goes to step 508. In the other cases, the wrap around mode is selected in step 506.

Subsequently, in step 508, the MPU 524 judges whether 60 seconds has elapsed from the reception of the final data. If 60 seconds has not elapsed, the process goes to step 514. In the other cases, the mode is shifted to the low power consumption mode in step 510.

In step 512, the process is kept in such a wait state as to wait for arrival of data from each sensor.

Thereafter, if the data from each sensor arrives, the processing of storing noise data is performed in step 518, and then the process goes to step 520. The noise data storing processing will be described in detail later.

If it is judged in step 514 that the data from the sensor arrives, the process goes to step 518. In the other cases, the process goes to step 520.

It is judged in step 520 whether a measurement end key is pushed through the keyboard. If the key concerned is pushed, the measurement is finished. In the other cases, the process goes to step 508.

Figure 7:
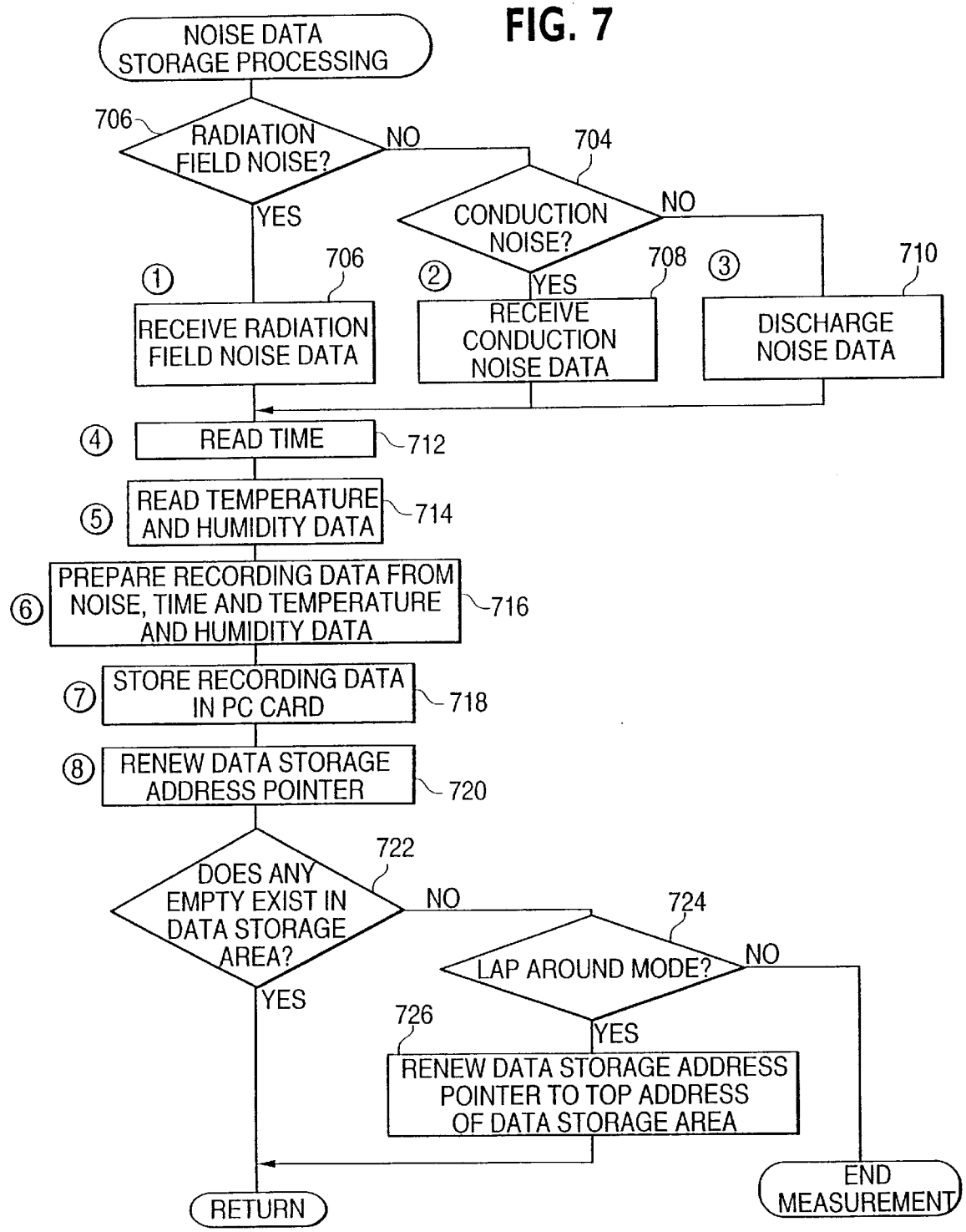
FIG. 7 is a flowchart showing noise data storing processing.

Next, the detailed processing content of the step 518 in FIG. 6 will be described with reference to FIG. 7.

The following processing is performed by the MPU 524 according to the program stored in the built-in ROM.

First, in step 702, it is judged by referring to the ID number of the received data whether the data concerned are associated with the radiation electromagnetic field noise. If the data concerned are associated with the radiation electromagnetic field noise, in step 706 the received data are recognized as the data of the radiation electromagnetic field noise, and the noise level thereof is determined by referring to the detection level in the data. In the other cases, the process goes to step 704.

In step 704, it is judged by referring to the ID number of the received data whether the data concerned are associated with the conduction noise. If the data concerned are associated with the conduction noise, in step 708 the received data are recognized as the data of the conduction noise, and the noise level thereof is determined by referring to the detection level in the data. In the other cases, in step 710 the received data are recognized as the data of the discharge noise, and the noise level thereof is determined by referring to the detection level in the data.

Each noise data occurs irregularly, but the noise data may occur continuously during a short time or plural kinds of noise data may occur simultaneously. Therefore, it is preferable to provide hardware and software (for example, buffering processing) so that the received data are prevented from being missed due to overrun during the processing of FIGS. 6 and 7.

By the above processing, the type and level of the noises are identified. Although not shown in the flowcharts, when it is judged by referring to the status information that the battery voltage at the sensor unit side is reduced, the measurement may be forcefully ceased and this fact is displayed so that a user is prompted to exchange the battery.

Subsequently, in step 712, the reception time of the received data is determined by the real-time clock 542.

Subsequently, the temperature and humidity data are obtained from the temperature sensor 510 and the humidity sensor 512.

Figure 9:
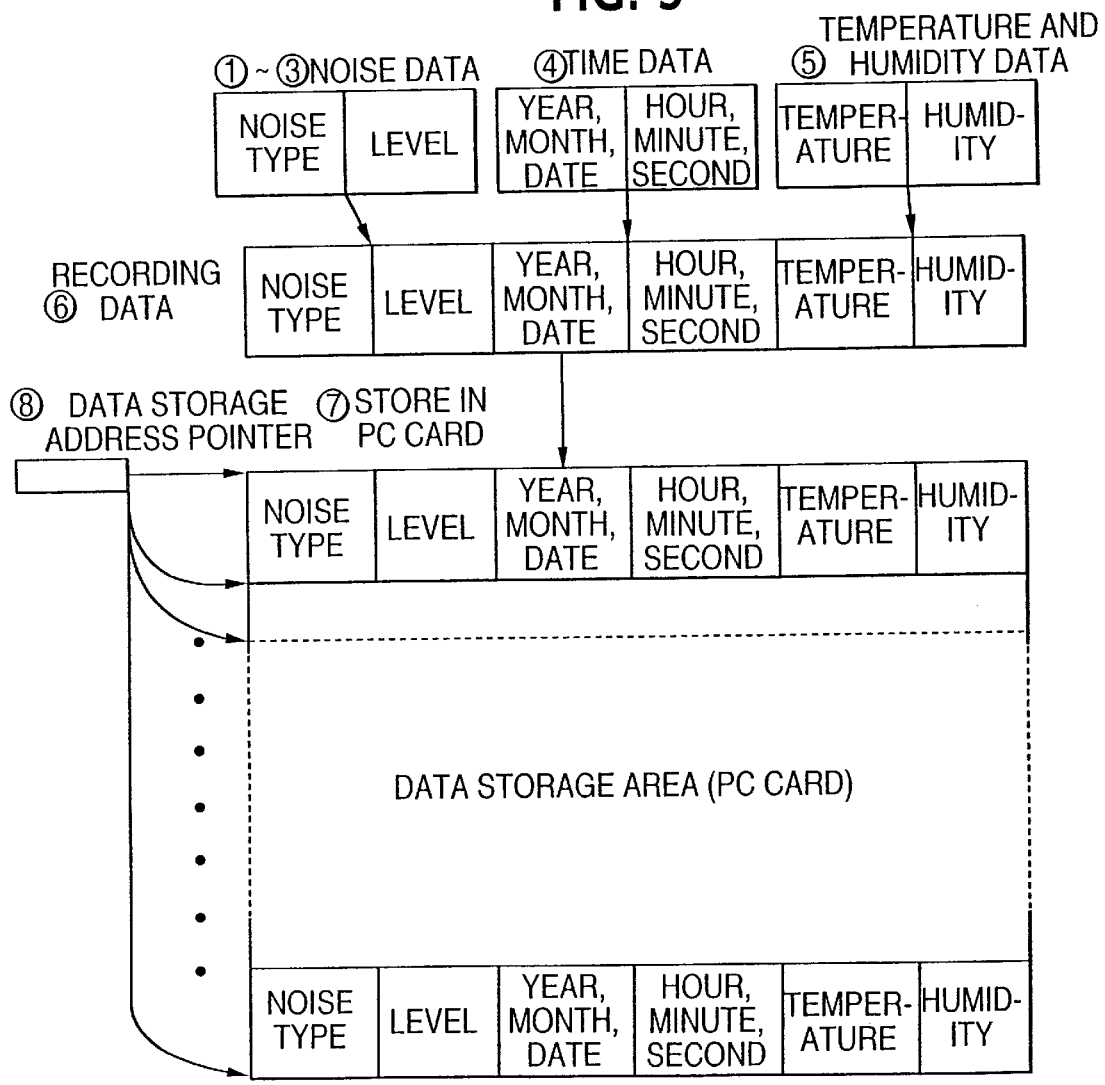
FIG. 9 is a diagram showing the operation of the apparatus.

Thereafter, in step 716, the type and level of the noises, the time data and the temperature and humidity data are integrated into one data set to form recording data. This process is shown in FIG. 9. Although not shown in FIG. 9, it is preferable to add a data check code (for example, sum check code) to every record of recording data in order to ensure reliability of the recording data.

Subsequently, in step 718 the recording data thus formed are stored the PC card 536.

In step 720, a data storage address pointer is renewed to get ready for storage of subsequent recording data. The value of the pointer may be stored in an area different from the data storage area of the PC card 536.

Subsequently, in step 722, the value of the data storage address pointer is compared with the final address of the data recording area of the PC card to check whether any empty area exists in the data recording area. If any empty area exists, the processing is finished (returns) and returns to the main flowchart shown in FIG. 6.

On the other hand, if no empty area exists, in step 724 it is judged whether the wrap around mode is selected. If the mode is not selected, no empty area exists, and thus the measurement is forcefully finished. Preferably, this fact is displayed on the LCD 540 to issue an alarm to a user.

If it is judged in step 724 that the wrap around mode is selected, the data storage address pointer is renewed to the top address of the data storage area because this mode permits so-called overwriting, and then the processing is finished (returns) and returns to the main flowchart of FIG. 6.

The noise levels which are detected in the various detection units as described above can be recorded in the PC card together with the types thereof the time information, etc. In the flowcharts, the display processing is not described in detail, but, it can suitably display various data such as detection data, recording data, etc.

A user of this apparatus can load a PC card having desired data recorded therein into another information processing device such as a personal computer or the like to read the recording data for an analysis work of the noise data. Of course, the recording data can be displayed on the display unit of the apparatus to perform the analysis work.

As described above, according to the present invention, there can be provided the noise detecting and recording apparatus which can be widely practically used for countermeasures against the malfunction of electronic equipment which is caused by noises.

INDUSTRIAL UTILITY

As described above, according to the present invention, under the condition that the apparatus normally operates under such an environment that various noises having strong levels occur, occurrence of each of noises which irregularly occur and have bad reproducibility is detected by each of sensors for detecting a discharge noise, a radiation electromagnetic field noise and a conduction noise respectively, and the level of the detected noise is recorded together with data indicating occurrence time, thereby allowing an apparatus which detects and records noises other than the electrostatic discharge noise to be used.

Further, according to the apparatus of the present invention, all the data which are measured by each of the detection units are not required to be transmitted to the main unit side, and only the data whose levels exceed a predetermined reference value are treated as detection data and transmitted to the main unit side, so that the processing speed of the data processing can be enhanced and the power saving of electronic equipment can be performed.

What is claimed is:

1. A noise detecting and recording apparatus, comprising:
   a first unit for detecting a conduction noise, and outputting level data corresponding to an amplitude level of the conduction noise together with noise type identifying data representing the conduction noise;
   a second unit for detecting a radiation electromagnetic field noise, and outputting level data corresponding to an amplitude level of the radiation electromagnetic field noise together with noise type identifying data representing the radiation electromagnetic field noise;
   a third unit for detecting a discharge noise, and outputting level data corresponding to and amplitude level of the discharge noise together with noise type identifying data representing charge noise;
   a temperature detection unit for detecting an ambient temperature, and outputting temperature data;
   a humidity detection unit for detecting a humidity level, and outputting humidity data;
   a processing device for processing data outputted from each of said first, second and third units, as well as the temperature data and the humidity data;
   a display device; and
   a recording device, wherein:
      said processing device receives the data outputted from each of said first, second, and third units as well as the temperature data and the humidity data, and supplies the data to said display device and said recording device;
      said display device displays the data received from said processing device; and said recording device records the data received from said processing device.

2. The noise detecting and recording apparatus as claimed in claim 1, wherein said second unit comprises:
   an antenna unit having antennas arranged in X, Y, Z axis directions respectively, and each antenna inducing a voltage corresponding to a magnitude of only a component in one-axis direction of an electric field intensity of an electromagnetic wave;
   differential amplifying circuits each of which is adapted to amplify the induced voltage of a corresponding antenna in each axis direction;
   an adding circuit for combining the amplified signals of the induced voltages of the antennas in the respective axis directions which are amplified by said differential amplifying circuits;
   a comparing circuit for comparing a composite result of said adding circuit with a plurality of predetermined reference levels; and
   a radiation electromagnetic field noise level detecting and outputting circuit for outputting composite result data which exceeds a highest reference level as the detected radiation electromagnetic field noise level.

3. The noise detecting and recording apparatus as claimed in claim 2, further including a time counting device for ascertaining the time, wherein said processing device detects a reception time of the data outputted from each of said first, second, and third units, using said time counting device and integrates the noise type identifying data and level data, which are contained in the data outputted from each of said first, second, and third units, and the reception time into one data set to record the one data set in said recording device.

4. The noise detecting and recording apparatus as claimed in claim 3, wherein said processing device supplies the one data set to said display device.

5. The noise detecting and recording apparatus as claimed in claim 3, wherein said recording device includes a card serving as a data recording medium, and a driver device for recording data in said card.

6. The noise detecting and recording apparatus as claimed in claim 4, wherein said recording device includes a card serving as a data recording medium, and a driver device for recording data in said card.

7. The noise detecting and recording apparatus as claimed in claim 2, wherein said recording device includes card serving as a data recording medium, and a driver device for recording data in said card.

8. The noise detecting and recording apparatus as claimed in claim 1, wherein said first unit comprises:
   a current transformer in which a voltage corresponding to a current flowing via a transmission line containing a power line and a signal line is induced;
   a peak detection circuit for detecting a positive-polarity peak and a negative-polarity peak of the induced voltage;
   an adding circuit for combining the positive-polarity peak and the negative-polarity peak which are detected by said peak detection circuit,
   a comparing circuit for comparing a composite result of said adding circuit with a plurality of predetermined reference levels;
   a conduction noise level detecting and outputting circuit for outputting digital data corresponding to the highest reference level in reference levels which the composite result exceeds.

9. The noise detecting and recording apparatus as claimed in claim 8, further including a time counting device for ascertaining the time, wherein said processing device detects a reception time of the data outputted from each of said first, second, and third units, using said time counting device and integrates the noise type identifying data and level data, which are contained in the data outputted from each of said first, second, and third units, and the reception time into one data set to record the one data set in said recording device.

10. The noise detecting and recording apparatus as claimed in claim 9, wherein said processing device supplies the one data set to said display device.

11. The noise detecting and recording apparatus as claimed in claim 10, wherein said recording device includes a card serving as a data recording medium, and a driver device for recording data in said card.

12. The noise detecting and recording apparatus as claimed in claim 9, wherein said recording device includes a card serving as a data recording medium, and a driver device for recording data in said card.

13. The noise detecting and recording apparatus as claimed in claim 8, wherein said recording device includes a card serving as a data recording medium, and a driver device for recording data in said card.

14. The noise detecting and recording apparatus as claimed in claim 1, further comprising a time counting device for ascertaining the time, wherein said processing device detects a reception time of the data outputted from each of said first unit, said second unit and said third unit, using a said time counting device and integrates the noise type identifying data and level data, which are contained in the data outputted from each of said first unit, said second unit and said third unit, and the reception time into one data set to record the one data set in said recording device.

15. The noise detecting and recording apparatus as claimed in claim 14, wherein said processing device supplies the one data set to said display device.

16. The noise detecting and recording apparatus as claimed in claim 15, wherein said recording device includes a card serving as a data recording medium, and a driver device for recording data in said card.

17. The noise detecting and recording apparatus as claimed in claim 14, wherein said recording device includes a card serving as a data recording medium, and a driver device for recording data in said card.

18. The noise detecting and recording apparatus as claimed in claim 1, further comprising a time counting device for ascertaining the time, wherein said processing device detects a reception time of the data outputted from each of said first unit, said second unit and third unit using said time counting device, further receives the temperature data and the humidity data from said temperature detection unit and said humidity detection unit, respectively, and integrates the noise type identifying data and the level data, which are contained in the data outputted from each of said first unit, said second unit and said third unit, and the reception time, as well as the temperature data and the humidity data into one data set to record the one data set in said recording device.

19. The noise detecting and recording apparatus as claimed in claim 18, wherein said processing device supplies the one data set to said display device.

20. The noise detecting and recording apparatus as claimed in claim 19, wherein said recording device includes a card serving as a data recording, medium, and a driver device for recording data in said card.

21. The noise detecting and recording apparatus as claimed in any one of claims 1 and 18, wherein said recording device includes a card serving as a data recording medium, and a driver device for recording data in said card.

22. The noise detecting and recording apparatus as claimed in claim 1, further including a driving circuit for driving said processing device, only when the output data from any one of said first, second and third units exists.

23. The noise detecting and recording apparatus as claimed in claim 1, wherein each of said first, second, and third units includes a data processing circuit for converting the detection data into digital data and outputting the digital data only when the level of detection data varies by a predetermined value.

24. The noise detecting and recording apparatus as claimed in claim 1, further including a power circuit using a battery as a power source for driving said apparatus.

25. The noise detecting and recording apparatus as claimed in claim 1, further comprising a housing for shielding said apparatus from an external electromagnetic wave, except for a display screen of said display device.

26. The noise, detecting and recording apparatus as claimed in claim 1, wherein each of said first, second, and third units includes a battery power source for supplying operating power, and monitoring means for monitoring reduction of the battery voltage, and outputs a monitoring result together with the noise type identifying data and the noise level data.

27. A noise detecting and recording apparatus, comprising:
 a first unit for detecting a conduction noise and outputting data corresponding to a level of the detected conduction noise;
 a second unit for detecting a radiation electromagnetic field noise and outputting data corresponding to a level of the detected electromagnetic field noise;
 a third unit for detecting a discharge noise and outputting data corresponding to a level of the detected discharge noise;
 a processing device for processing the data outputted from each of said first, second and third units;
 a display device for displaying the detection data; and
 a recording device for recording the detection data, wherein:
  each of said first, second, and third units includes a data processing circuit for converting the detection data to digital data and outputting the digital data only when the level of the detection data varies by a predetermined value, and
  said processing device receives the digital data outputted from each of said first, second, and third units to supply the digital data to said display device, and receives the digital data outputted from each of said first, second, and third unit to record the digital data in said recording device.

28. An apparatus for detecting and recording noise in an electronic equipment for noise analysis, comprising:
 a noise detector unit which detects an electrostatic discharge noise occurring at said electronic equipment and produces data corresponding to the electrostatic discharge noise, which detects a radiation electromagnetic field noise occurring at said electronic equipment and produces data corresponding to the radiation electromagnetic field noise, and which detects a conduction noise occurring at said electronic equipment and produces data corresponding to the conduction noise;
 a sensor unit which senses an ambient temperature and a humidity level of said electronic equipment, and produces data corresponding to the ambient temperature and the humidity level of said electronic equipment; and
 a processor which processes data from said noise detector unit and said sensor unit for a visual display on a display device and for recording on a recording device for said noise analysis.

29. The apparatus as claimed in claim 28, further comprising a real-time clock for enabling said processor to display and/or record the data from said noise detector unit and said sensor unit on said display device and/or on said recording device in real-time.

30. The apparatus as claimed in claim 28, wherein said noise detector unit comprises:
 an electrostatic discharge noise detector which detects the electrostatic discharge noise occurring at said electronic equipment and produces data corresponding to the electrostatic discharge noise;
 an electromagnetic radiation field noise detector which detects the radiation electromagnetic field noise occurring at said electronic equipment and produces data corresponding to the radiation electromagnetic field noise; and a conduction noise detector which detects a conduction noise occurring at said electronic equipment and produces data corresponding to the conduction noise.

31. The apparatus as claimed in claim 30, wherein said electrostatic discharge noise detector comprises:

a monopole antenna which induces a voltage corresponding to an electric field intensity variation of a transit electromagnetic wave;

a positive-polarity detector which detects a positive polarity of the induced voltage, makes a comparison with a plurality of reference levels and produces a first polarity signal;

a negative-polarity detector detects a negative polarity of the induced voltage, makes a comparison with said plurality of reference levels and produces a second polarity signal; and an electrostatic discharge identifier which identifies a specific type of said electrostatic discharge noise in response to said first and second polarity signals.

32. The apparatus as claimed in claim 30, wherein said electromagnetic radiation field noise detector comprises:

an antenna unit having antennas arranged in X, Y, Z axis directions respectively, and each antenna inducing a voltage corresponding to a magnitude of only a component in one-axis direction of an electric field intensity of a transit electromagnetic wave;

differential amplifiers each of which is adapted to amplify the induced voltage of each antenna in each axis direction;

an adder which combines amplified signals of the induced voltages of the antennas in the respective axis directions which are amplified by said differential amplifiers; and a comparator which makes a comparison of composite results of said adder with a plurality of reference levels, and which produces composite result data which exceeds a highest reference level as the radiation electromagnetic field noise.

33. The apparatus as claimed in claim 30, wherein said conduction noise detector comprises:

a current transformer which induces a voltage corresponding to a current flowing via a transmission line containing a power line and a signal line;

a peak detector which detects a positive-polarity peak and a negative-polarity peak of the induced voltage;

an adder which combines the positive-polarity peak and the negative-polarity peak; and a comparator which makes a comparison between a composite result of said adder with a plurality of reference levels, and produces digital data which corresponds to a highest reference level as the conduction noise.

34. The apparatus as claimed in claim 30, wherein said recording device include a card serving as a data recording medium and a driver device for recording data in said card.

* * * * *